(12) United States Patent
Nakai et al.

(10) Patent No.: US 6,303,902 B1
(45) Date of Patent: Oct. 16, 2001

(54) APPARATUS AND METHOD FOR PROCESSING

(75) Inventors: Izuru Nakai, Toyonaka; Ken Muneyuki, Neyagawa, both of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/219,506

(22) Filed: Dec. 23, 1998

(30) Foreign Application Priority Data

Dec. 25, 1997 (JP) .................................... 9-356852

(51) Int. Cl.$^7$ .................................... B23K 26/00
(52) U.S. Cl. .................................... 219/121.82; 219/121.6
(58) Field of Search .................. 219/121.82, 121.83, 219/121.84, 121.6, 121.85, 161, 121.8; 269/21; 83/152, 145

(56) References Cited

U.S. PATENT DOCUMENTS

| | | | |
|---|---|---|---|
| 3,583,561 | * | 6/1971 | Wiesler et al. . |
| 3,981,230 | | 9/1976 | Lee . |
| 4,391,511 | * | 7/1983 | Akiyama et al. . |
| 4,517,436 | | 5/1985 | Lawrence . |
| 4,543,464 | * | 9/1985 | Takeuchi . |
| 4,584,479 | * | 4/1986 | Lamattina et al. . |
| 4,607,167 | * | 8/1986 | Petric . |
| 4,670,639 | | 6/1987 | Behn . |
| 5,227,606 | | 7/1993 | Weeks et al. . |
| 6,024,830 | * | 2/2000 | Nedblake et al. . |
| 6,090,330 | * | 7/2000 | Gawa et al. . |

FOREIGN PATENT DOCUMENTS

| | | |
|---|---|---|
| 38 11 748 | 8/1991 | (DE) . |
| 9-136180 | 5/1997 | (JP) . |
| 10-296473 | 11/1998 | (JP) . |
| 97/11841 | 4/1997 | (WO) . |

* cited by examiner

Primary Examiner—Tom Dunn
Assistant Examiner—Jonathan Johnson
(74) Attorney, Agent, or Firm—Wenderoth, Lind & Ponack, L.L.P.

(57) ABSTRACT

A holding member is set, which sucks at a contact face, only a part of the periphery of a process area of a sheet-like article to hold the article. The holding member and the sheet-like article are moved relatively in such manner that the contact face is not physically in touch with an already processed area while the contact face maintains its suction to the sheet-like article. A deformation of the already processed area or a mixture of foreign articles to the already processed area can be prevented.

6 Claims, 7 Drawing Sheets

APPARATUS AND METHOD FOR PROCESSING

BACKGROUND OF THE INVENTION

The present invention relates to a processing apparatus and a processing method used in processing thin sheet-like articles for multilayer boards of electric appliances, etc. with the use of, e.g., a laser.

Processing with laser light has been considered for thin sheet articles of resin or metal used for multilayer boards or the like where high-density electronic circuits are to be formed, so as to process fine patterns at required points at high speed with high accuracy. In producing three-dimensional highly integrated boards, high process accuracy is required particularly to form through holes (via holes) for via electrodes of the multilayer board. At the same time, the laser processing is required to be carried out to each of as many circuits as possible arranged in matrix on one base thin sheet article of a large area to meet low-cost production.

In order to accurately process surfaces of thin sheet bodies of a large area by a laser, the sheet article is placed and held on a table and then the laser light is projected on the article to process it.

However, since the article is placed on the table, via holes can not be formed in the article with the laser light because the surface of the table might be subjected to some damage when the via holes are formed in the article.

SUMMARY OF THE INVENTION

The present invention is devised to solve the above-described inconvenience, and has for its object to provide an apparatus and a method whereby via holes can be formed in thin sheet-like articles with laser light without any damage to a member for supporting the articles.

In accomplishing these and other aspects, according to a first aspect of the present invention, there is provided a processing apparatus for sheet-like articles, which comprises:

a tension device for holding a sheet-like article while applying a tensile force to the sheet-like article;

a holding member for holding a part of a periphery of a process area of the sheet-like article when the sheet-like article is processed at the processing area;

a moving device for relatively moving the sheet-like article and the holding member to form a plurality of the process areas in the sheet-like article in a state wherein the sheet-like article is pulled by the tension device and held by the holding member; and a control device for letting the moving device relatively move the sheet-like article and the holding member with preventing the holding member from rubbing the process areas already formed in the sheet-like article.

According to a second aspect of the present invention, there is provided a processing apparatus for sheet-like articles according to the first aspect, wherein the part of the periphery of the process area held by the holding member is located in parallel to a row direction of the sheet-like article in the case of the relative movement by the moving device in the row direction and at a forward side of the movement in the case of the relative movement in a column direction of the sheet-like article so that the holding member does not rub the already processed areas of the sheet-like article.

According to a third aspect of the present invention, there is provided a processing apparatus for sheet-like articles according to the first or second aspect, wherein the sheet-like article is processed by laser light, and the apparatus further comprising a laser light projection device for projecting the laser light for the processing to the sheet-like article.

According to a fourth aspect of the present invention, there is provided a processing apparatus for sheet-like articles according to the third aspect, wherein the sheet-like article is processed to form a through hole by laser light, and the apparatus further comprising a laser light projection device for projecting the laser light for the processing to the sheet-like article.

According to a fifth aspect of the present invention, there is provided a processing apparatus for sheet-like articles according to any one of the first to fourth aspects, wherein the holding of the sheet-like article by the holding member is achieved through a suction operation, and the apparatus further comprising a sucking device for performing the suction operation.

According to a sixth aspect of the present invention, there is provided a method for processing sheet-like articles, which comprises:

holding a sheet-like article while applying a tensile force to the sheet-like article to be processed and holding a part of a periphery of a process area to be processed of the sheet-like article by a holding member; and relatively moving the sheet-like article and the holding member in order to form a plurality of the process areas in the sheet-like article in such manner that the process areas already formed in the sheet-like article are not rubbed by the holding member while the part of the periphery of the process area is held.

According to a seventh aspect of the present invention, there is provided a method for processing sheet-like articles according to the sixth aspect, whereby the sheet-like article is processed by laser light.

According to an eighth aspect of the present invention, there is provided a method for processing sheet-like articles according to the seventh aspect, whereby the sheet-like article is processed to form a through hole by laser light.

According to a ninth aspect of the present invention, there is provided a method for processing sheet-like articles according to the sixth, seventh or eighth aspect, whereby the holding of the part of the periphery of the process area is achieved through a suction operation.

BRIEF DESCRIPTION OF THE DRAWINGS

These and other aspects and features of the present invention will become clear from the following description taken in conjunction with the preferred embodiments thereof with reference to the accompanying drawings, in which.

DETAILED DESCRIPTION OF THE PREFERRED EMBODIMENTS

Before the description of the present invention proceeds, it is to be noted that like parts are designated by like reference numerals throughout the accompanying drawings.

A laser processing apparatus for sheet-like articles and a method carried out by the laser processing apparatus according to an embodiment of the present invention, will be described with reference to the drawings in which like parts are designated by like reference numerals.

Before the embodiment is described, first, the content of the present invention is described below.

Figure 7:
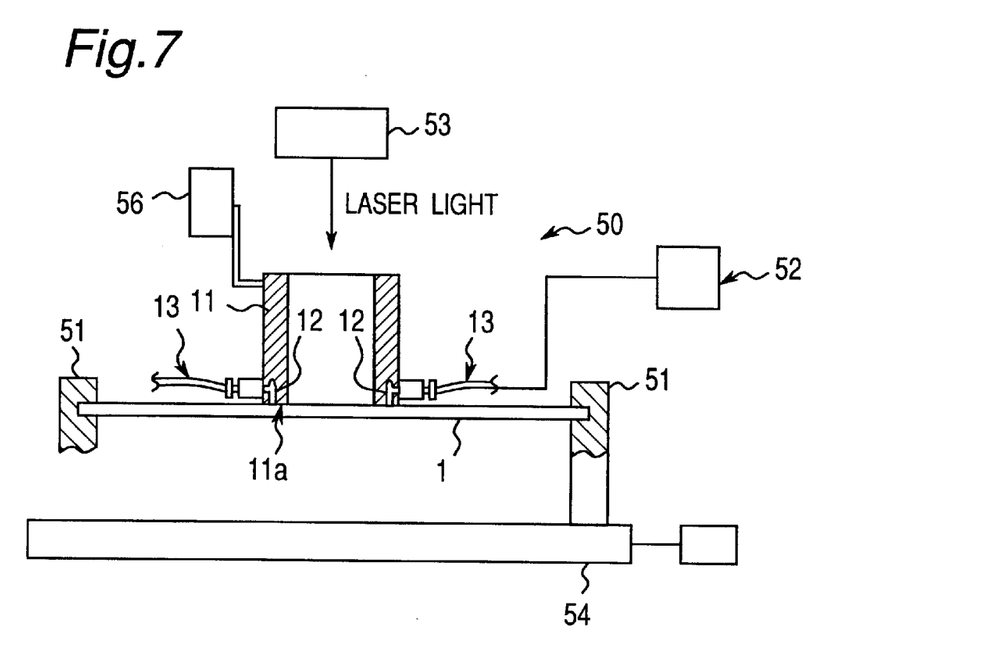
FIG. 7 is a side view of a laser processing apparatus.
Figure 8:
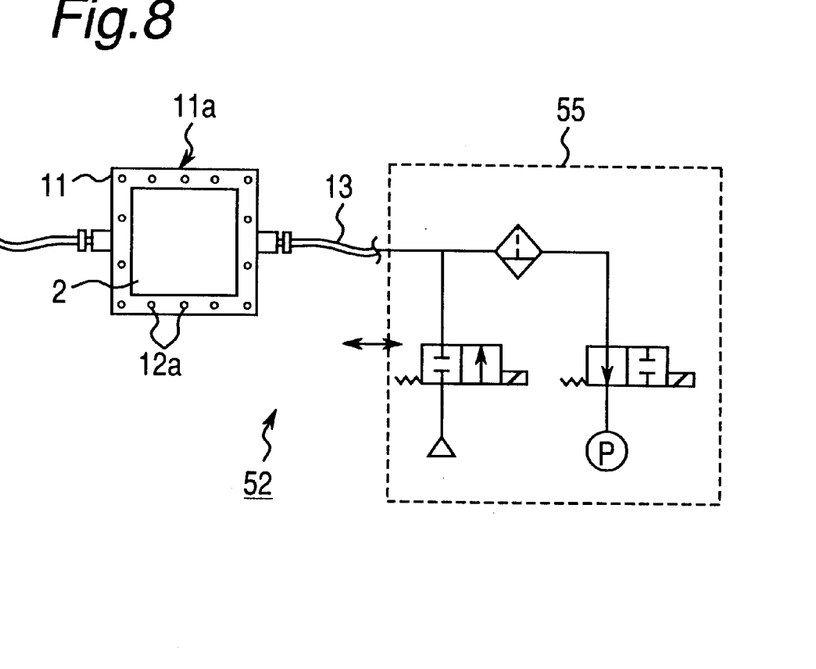
FIG. 8 is a diagram showing the constitution of a suction support device shown in FIG. 7.

The applicant has proposed, by way of example, a laser processing apparatus 50 as shown in FIGS. 7 and 8 in Japanese Patent Application No. 9-23081 (the counterpart U.S. Pat. No. 6,090,330) to accurately process thin sheet articles of a large area by a laser. The laser processing apparatus 50 includes a clamp device 51 applying a tension to a thin sheet article 1, a suction support device 52 having a frame-like member 11 and a suction device 55 as described below for sucking and supporting one fraction part 2 corresponding to one circuit part of the thin sheet article 1 to maintain the part 2 in a flat state by the above tension, a laser light projection device 53 for processing the fraction part 2 sucked and supported by the suction support device 52 with laser light, a moving device 54 for moving the thin sheet article 1 relative to the laser light projection device 53 and the suction support device 52 so that each fraction part 2 of the thin sheet article 1 is sequentially processed with laser light, and a positioning device 56 for moving and positioning the frame-like member 11 relative to the thin sheet article 1 in a thicknesswise direction of the thin sheet article 1.

As shown in FIG. 8, the suction support device 52 includes the frame-like member 11 of a square pipe and the suction device 55. A plurality of leading end openings 12a are provided in a contact face 11a of the frame-like member 11 confronting the thin sheet article 1, thereby letting the contact face 11a surrounding the whole periphery of the fraction part 2 of the thin sheet article 1 suck and support the fraction part 2. The leading end openings 12a communicate with one another through a conduit 12 in the frame-like member 11, and are connected to the suction device 55 via the conduit 12 and a pipe 13.

A positioning device 56 brings the frame-like member 11 into touch and out of touch with the thin sheet article 1. When the frame-like member 11 is brought to a position where the frame-like member 11 is separated from the thin sheet article 1, the thin sheet article 1 can be moved at high speed by the moving device 54 in a noncontact state relative to the frame-like member 11.

According to the laser processing apparatus 50 constituted as above, since the thin sheet article 1 is moved by the moving device 54, the frame-like member 11 should be positioned by the positioning device 56 in the thicknesswise direction at every time of the above movement of the thin sheet article 1, which hinders further improvement in process speed for the thin sheet article 1. This problem can be eliminated by a method whereby the frame-like member 11 and the thin sheet article 1 are moved relatively to the fraction part 2 to be processed next while the frame-like member 11 keeps sucking the thin sheet article 1.

Figure 9:
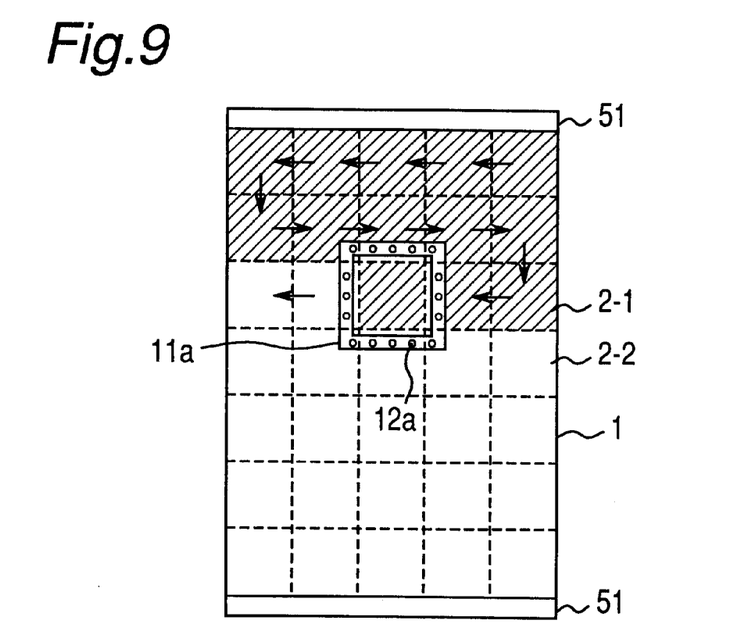
FIG. 9 is a diagram of an operation of the laser processing apparatus shown in FIG. 7, specifically showing a direction of a relative movement of a frame-like member and a thin sheet article.

Meanwhile, in the case of the above movement while sucking, the whole periphery of the fraction part 2 is sucked by the contact face 11a of the frame-like member 11 in the suction support device 52 of the laser processing apparatus 50 as described above, and therefore, a laser-processed part of the sheet article 1 which is indicated by oblique lines in FIG. 9 unfavorably rubs against the contact face 11a of the frame-like member 11 in the above method of relatively moving the frame-like member 11 and thin sheet article 1, as indicated in FIG. 9, with the result that the processed part is deformed or foreign articles are mixed and caught in the sheet-like article.

The present embodiment of the present invention is devised to solve the above-described inconvenience, and has for its object to provide an apparatus and a method for processing sheet-like articles whereby thin sheet-like articles are processed at improved process speed as compared with the previous apparatus and method, without deforming parts of the thin sheet-like article after being processed with laser light and while preventing foreign articles from being mixed in the thin sheet-like articles.

Figure 1:
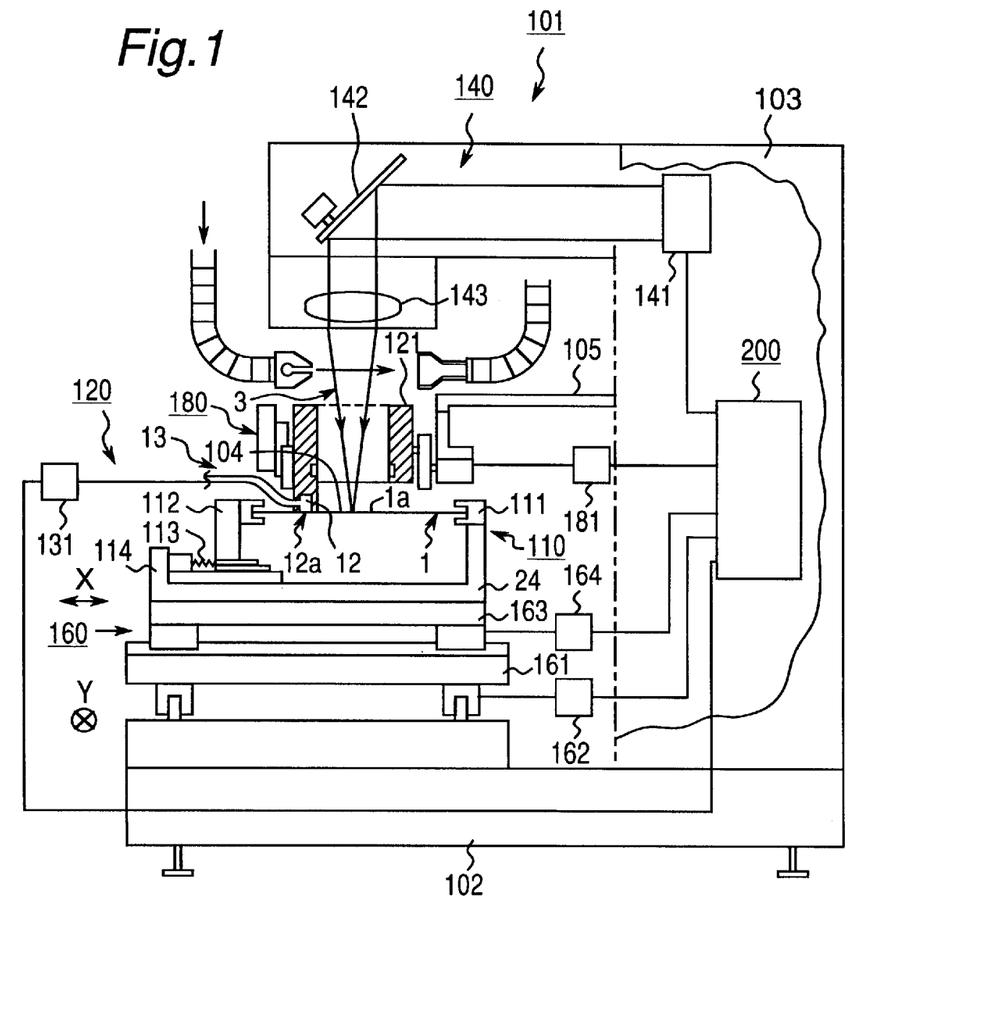
FIG. 1 is a side view of a laser processing apparatus for sheet-like articles in an embodiment of the present invention.

The embodiment exemplifies thin sheet-like articles formed of resin which are used for multilayer boards of electric appliances or the like and each of which has a thickness of about 0.15–0.2 mm. The material is not restricted so long as the article is like a thin sheet. Although laser processing is adopted as an example of a method of processing the sheet-like article, for example, to form through holes (via holes) for via electrodes of the multilayer board, the method is not limited to the laser processing. Specifically, printed circuit boards with components mounted at high density have been recently requested because of miniaturization of electronics equipment. The present embodiment can be applied to such printed circuit board production. As one example of the printed circuit board, several tens through serveral hundreds of through holes are formed in a sheet of thin printed circuit board material with a thickness of several tens of micrometers through several hundreds of micrometers through the laser processing, then conductive paste is inserted into the formed holes, and then the boards are laminated with each other to form a multilayer board while the conductive paste in each hole is connected to a specified electrode(s) or a circuit(s). During the above through hole formation, it is necessary to form through holes in the board. In order to form such a multilayer board with good accuracy, it is preferable to apply the present embodiment to such through hole formation, because through holes can be formed with good accuracy and the optimum configuration while each board as the material is held without any obstruction to form through holes. FIG. 1 shows a laser processing apparatus 101 for sheet-like articles of the present embodiment. The laser processing apparatus 101 for sheet-like articles is constituted substantially in the same manner as the above-described laser processing apparatus 50. However, suction support device 120 and a control device 200 to be described later are different from in the laser processing apparatus 50, which feature the laser processing apparatus 101 for sheet-like articles of the embodiment.

The laser processing apparatus 101 for sheet-like articles has a tension device 110 corresponding to the above-described clamp device 51, a suction support device 120 corresponding to the above-described suction support device 52 except for different portions, a laser light projection device 140 corresponding to the above-described laser light projection device 53, a moving device 160 corresponding to the above-described moving device 54, a positioning device 180 corresponding to the above-described positioning device 56, and a control device 200. Each of these parts will be depicted in detail below.

The moving device 160 with the tension device 110 is set on a base 102 constituting the laser processing apparatus 101 for sheet-like articles. The moving device 160 is equipped with a Y-table 161 which is slid by a driving device 162 in a Y direction of X, Y directions orthogonal to each other on a plane and an X-table 163 which is arranged over the Y-table 161 and slid by a driving device 164 in the X direction. The driving devices 162, 164 are connected to the control device 200. The control device 200 controls each movement amount of the Y-table 161 and X-table 163.

The tension device 110 set on the X-table 163 has a fixed clamp member 111 and a movable clamp member 112 both extending in the Y direction and faced to each other. A rectangular sheet-like article 1 to be processed with laser light is arranged at an area between the clamp member 111 and the clamp member 112. While side edge portions in parallel to, e.g., the Y direction of the thus-arranged sheet-like article 1 are held by the clamp member 111 and the clamp member 112, the sheet-like article 1 is pulled in the X direction. Specifically, the movable clamp member 112 is mounted in a manner to be movable in the X direction above the X-table 163, and moreover is urged at all times by an expansion force of a spring 113 set between a side edge part 114 in the X direction of the X-table 163 and the clamp member 112 towards the side edge part 114. The sheet-like article 1 when held between the clamp member 111 and the clamp member 112 is accordingly pulled in the X direction by the expansion force acting to the movable clamp member 112 so that a tensile force is applied to the sheet-like article 1. The holding of the sheet-like article 1 by the clamp members 111, 112 can be released upon necessities after the sheet-like article 1 is completely processed or on the similar occasion.

The laser light projection device 140 projects laser light to the sheet-like article 1 set as above from a thicknesswise direction of the sheet-like article 1. The laser light projection device 140 includes a laser light generation device 141, a mirror 142, and a lens 143. The laser light generation device 141 is fitted to a frame 103 standing on the base 102. The laser light projected from the laser light generation device 141 is deflected towards the sheet-like article 1 by the mirror 142. Thereafter, a focus of the laser light is adjusted by the lens 143 to be met on a process face 1a of the sheet-like article 1, and then the laser light is projected to the process face 1a. The laser light generation device 141 is connected to the control device 200, and therefore the generation of laser light is controlled by the control device 200.

Roughly, the suction support device 120 which features the embodiment comprises a holding member 121 holding through a suction operation a part of the periphery of a process area 104 of the sheet-like article 1 to be processed by the laser light so as to maintain the process area 104 in a flat state by the above tensile force, and a sucking device 131 connected to the holding member 121 to execute the suction operation. The holding member 121 of the suction support device 120 is supported above the sheet-like article 1 by the positioning device 180 and is movable in a thicknesswise direction of the sheet-like article 1.

Figure 2:
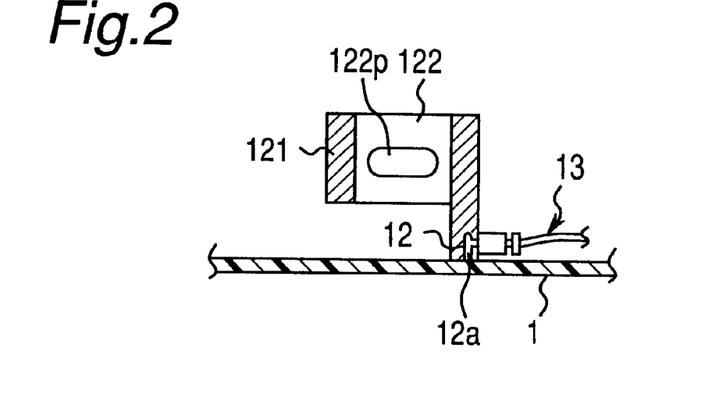
FIG. 2 is a sectional view of a part of a holding member of the apparatus shown in FIG. 1.
Figure 3:
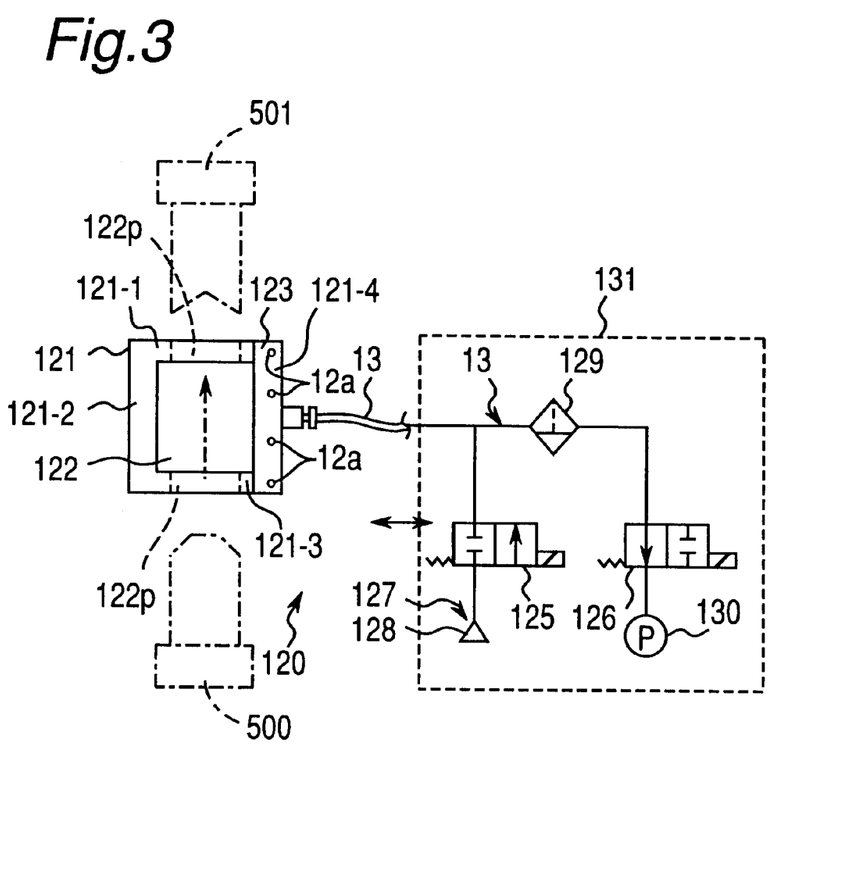
FIG. 3 is a diagram of the constitution of an adhesion support device of FIG. 1.

The holding member 121 will be more specifically depicted. According to the present embodiment, the holding member 121 corresponds to the frame-like member 11 and is a flat body shaped like a frame having a square hollow part 122 corresponding to the above process area 104, as shown in FIG. 3. A difference from the earlier-discussed frame-like member 11 is that only one of four frame members 121-1, 121-2, 121-3 and 121-4 of the holding member 121, for instance, 121-4 is in touch at a contact face 123 with the sheet-like article 1, as is clear from FIGS., 2 and 3, whereas every one of four frame members constituting the frame-like member 11 of FIG. 7 is in touch with the sheet-like article 1. The hollow part 122 of the holding member 121 is formed in a size not to interfere with a laser light 3 passing the lens 143. The holding member 121 conforms to the periphery of each process area 104 of the sheet-like article 1. Opening parts 12a are formed at the contact face 123 to hold the sheet-like article 1 through the suction operation. The opening parts 12a are guided to the sucking device 131 via a conduit 12 formed in the frame member 121-4 and a flexible tube 13 connected to the conduit 12.

Figure 4:
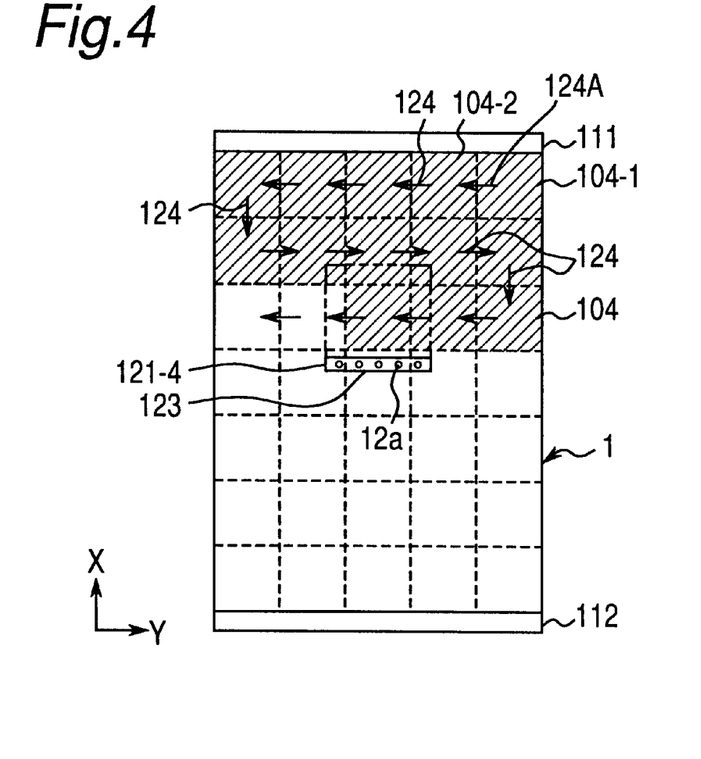
FIG. 4 is a diagram of an operation of the laser processing apparatus for sheet-like articles of FIG. 1, specifically indicating a direction of a relative movement of the holding member and the sheet-like article.

While only the contact face 123 is kept in touch with the sheet-like article 1 thereby holding the sheet-like article 1 through the suction operation, in the embodiment, the moving device 160 drives the holding member 121 to move relatively to the sheet-like article 1 as indicated by arrows 124 in FIG. 4. Therefore, although the suction operation is maintained, the sheet-like article 1 is processed all over the face, e.g., in matrix thereby obtaining process areas 104 without the contact face 123 brought in touch with already processed areas 104.

Since the sheet-like article 1 is held through the suction operation at the contact face 123, the sheet-like article 1 is prevented from slacking because of its own weight and consequently accurate laser processing is enabled to the process areas 104.

A direction of the movement of the contact face 123 and the holding member 121 relative to the sheet-like article 1 so as to keep the contact face 123 from rubbing the laser-processed areas, that is, a direction in which the laser processing is performed is as follows. According to the present embodiment, as shown in FIG. 4 and described hereinabove, when the process areas 104 are formed in matrix in the sheet-like article I and the holding member 121 moves relatively to the sheet-like article 1 in a staggered locus, the contact face 123 preferably extends in parallel to a row direction, i.e., in the Y direction and is preferably disposed at the side of a column direction, namely, in the X direction.

According to the present embodiment, the contact face 123 never rubs the areas already processed with laser light and, the holding member 121 and the sheet-like article 1 are relatively moved zigzag. The movement amount is rendered minimum. Since the contact face 123 always comes to touch with the area not yet processed, a dead space 106 to let the contact face 123 pass as shown in FIG. 5 is eliminated between the adjacent process areas 104 in the column direction, so that a maximum count of process areas 104 is produced in one sheet-like article 1.

Figure 5:
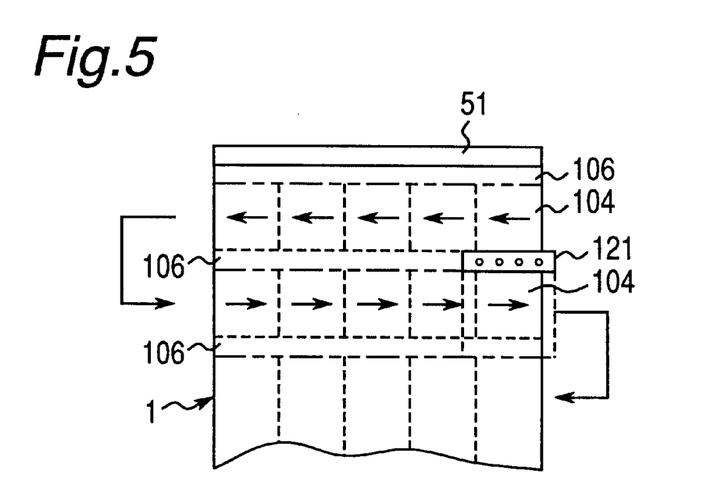
FIG. 5 is a diagram of another example of the direction of the relative movement of FIG. 4.
Figure 6:
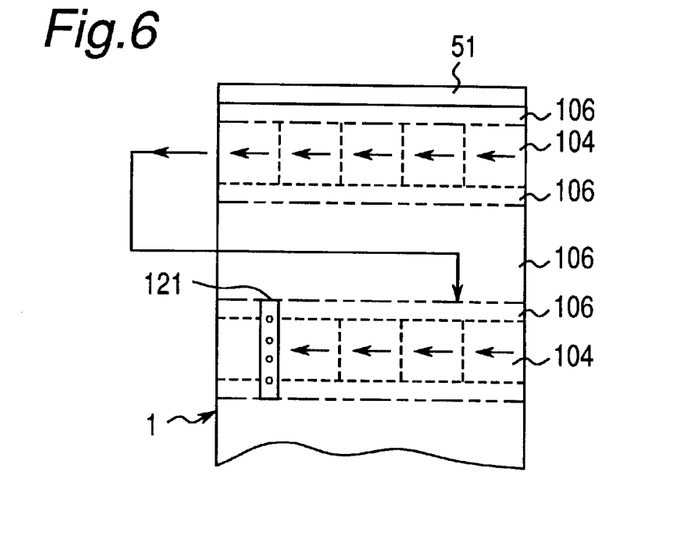
FIG. 6 is a diagram of a further example of the direction of the relative movement of FIG. 4.

In the case where the above movement amount and the count of process areas 104 can be smaller than in the embodiment, for instance, the contact face 123 and directions of the relative movements shown in FIGS. 5 and 6 are adoptable.

Figure 10:
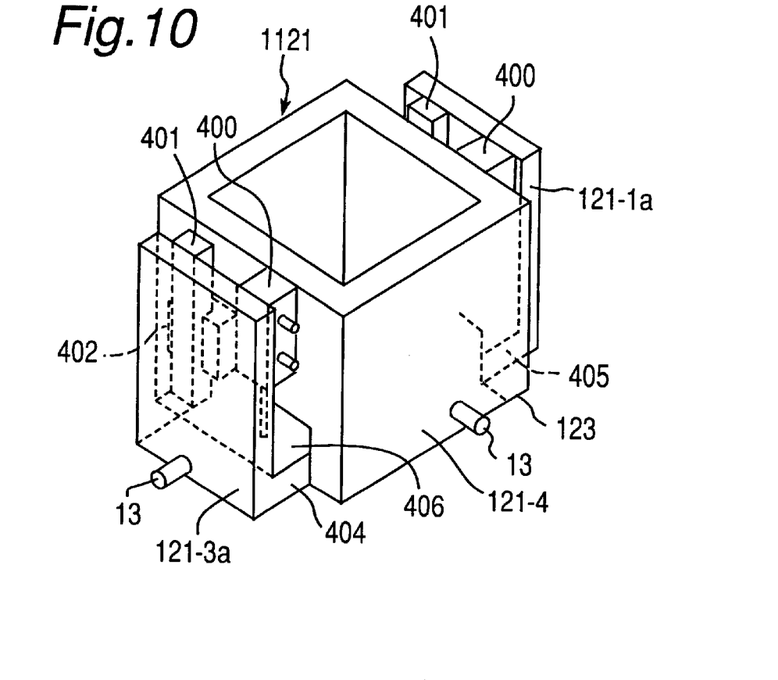
FIG. 10 is a perspective view of a holding member of a laser processing apparatus for sheet-like articles in a modification of the embodiment of the present invention.
Figure 11:
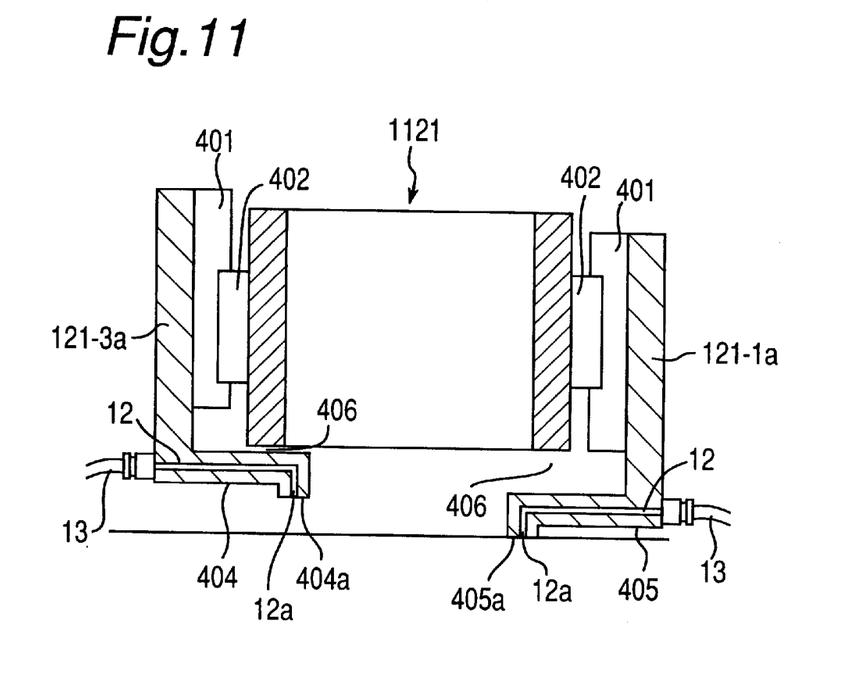
FIG. 11 is a sectional view of the holding member shown in FIG. 10.
Figure 12:
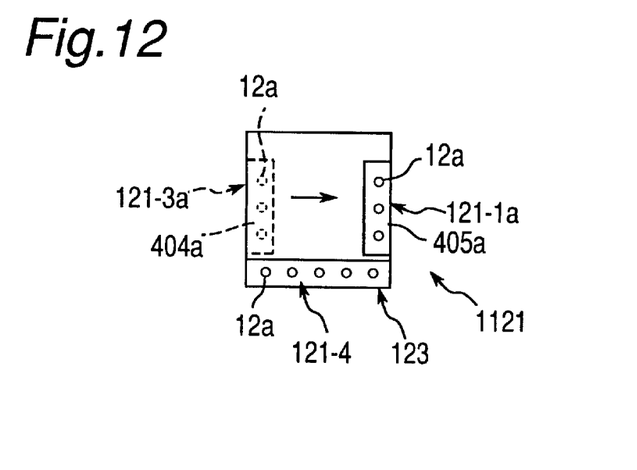
FIG. 12 is a bottom view of the holding member shown in FIG. 10.

As one modification of the embodiment, as shown in FIGS. 10, 11, and 12, the frame members 121-3*a* and 121-1*a* are additionally arranged on the holding member 1121 in parallel to each other in the column direction of the holding member 1121 perpendicular to the longer axial direction of the contact face 123 of the frame member 121-4, namely, in the X direction in the modification, and each of the frame members 121-3*a* and 121-1*a* has a length shorter than the side length of the process area 104 in the X direction. Each of the frame members 121-3*a* and 121-1*a* has at one side thereof a guide bar 401 slidably held and guided by a C-shaped guide member 402 fixed to the holding member 1121 and elongated in the vertical direction of the sheet-like article 1, and at the other side thereof a driving device 400 such as an air cylinder fixed to the holding member 1121 for which a piston rod is fixed to a lower end L-shaped bend portion 404 or 405 of the frame member 121-3*a* or 121-1*a*. Thus, when the driving devices 400 are driven, the frame members 121-3*a* and 121-1*a* are independently moved upward or downward so that the lower end-L-shaped bend portions 404, 405 are independently moved upward or downward within spaces 406 at a lower end portion of the holding member 1121 so as to move into contact with the sheet-like article 1 or separate therefrom. Openings 12*a* are formed in contact faces 404*a*, 405*a* of the L-shaped bend portions 404, 405 of the frame members 121-3*a* and 121-1*a* while the contact faces 404*a*, 405*a* can bring into contact with the sheet-like article 1, so that the sheet-like article 1 can be sucked through the openings 12*a* and held with the suction.

Figure 13:
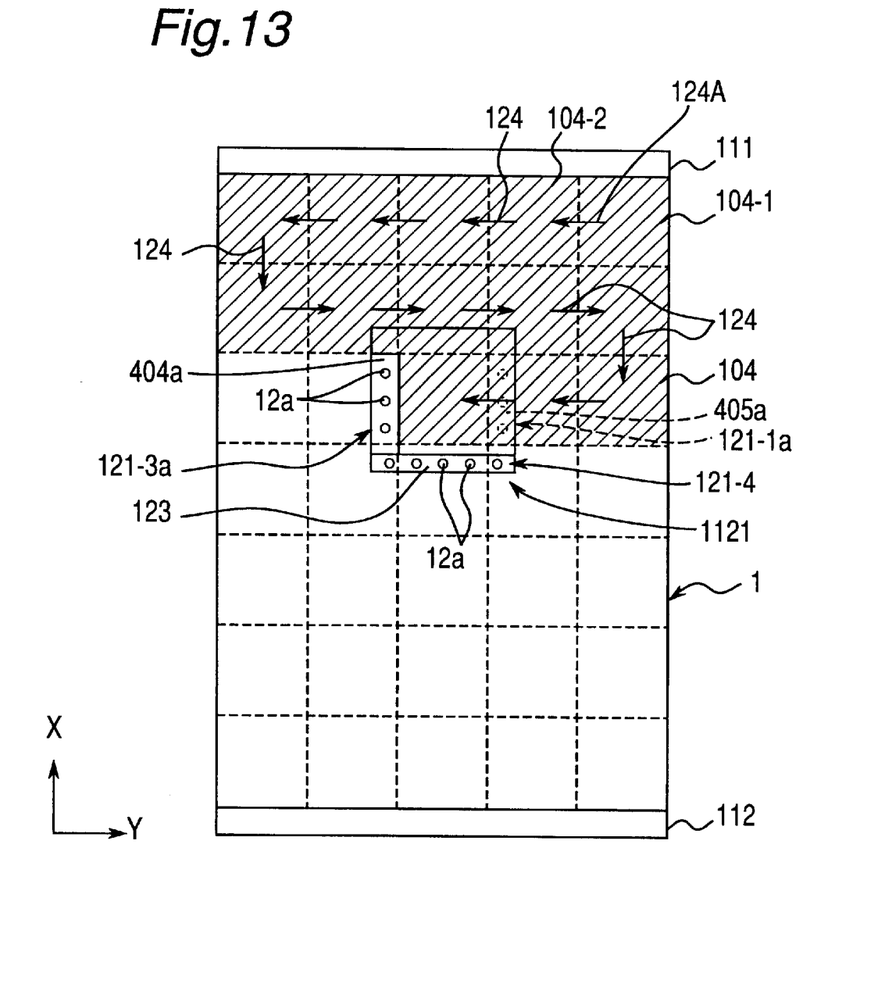
FIG. 13 is a diagram of an operation of the laser processing apparatus for sheet-like articles of FIG. 10.

In the modification, in a case where the holding member 1121 relatively moves on the sheet-like article 1 in zigzag as shown in FIG. 13, when the holding member 1121 moves in, for example, the left direction of FIG. 13, the following operation is carried out. That is, as shown by solid lines in FIG. 13, the contact face 404*a* of the left frame member 121-3*a* located at the front side of the moving direction of the holding member 1121 and the contact face 123 of the frame member 121-4 bring into contact with the sheet-like article 1 with the sheet-like article 1 sucked and held with the left frame member 121-3*a* and the frame member 121-4, while the contact face 405*a* of the right frame member 121-1*a* located at the rear side of the moving direction of the holding member 1121 is separated from the sheet-like article 1. Under such a condition, the holding member 1121 moves on the process area 104 in the left direction. On the other hand, the holding member 1121 moves in, for example, the right direction of FIG. 13, the following operation is carried out. As shown in FIG. 12, the contact face 405*a* of the right frame member 121-1*a* located at the front side of the moving direction of the holding member, 1121 and the contact face 123 of the frame member 121-4 move into contact with the sheet-like article 1 with the sheet-like article 1 sucked and held with the right frame member 121-1*a* and the frame member 121-4, while the contact face 404*a* of the left frame member 121-3*a* located at the rear side of the moving direction of the holding member 1121 is separated from the sheet-like article 1. Under such a condition, the holding member 1121 moves on the process area 104 in the right direction. In such a manner, when the zigzag processing is carried out, either one of the contact faces 404*a* and 405*a* which is located at the front side of the moving direction is held at the same height as the sheet-like article 1 to be capable of sucking and holding the sheet-like article 1 and the other of them is moved upward to a height so as to not contact with the sheet-like article 1. These operations are carried out at a position where the moving direction of the holding member 1121 is changed from the right to left or left to right directions, so that the contact face located at the front side of the moving direction is moved downward into contact with the sheet-like article 1 while the contact face located at the rear side of the moving direction is moved upward so as to not contact with the sheet-like article 1, that is, to separate from the sheet-like article 1. According to the above height exchange operation at the contact faces at the front and rear sides of the moving direction, the holding member 1121 does not rub the already laser-processed area with the contact faces 123, 404*a*, 405*a* and the processing can be carried out continuously. According to the above arrangement, two peripheral sides of the rectangular process area 104 can be always held with the suction, and thus, the process area 104 of the sheet-like article 1 in the vertical direction can be positioned with improved stability, as compared with a case where one peripheral side of the rectangular process area 104 is always held with the suction.

An example of the holding member 121 is formed like a square frame having the hollow part 122 of approximately 10 cm×10 cm, in which the contact face 123 has a breadth of about 1 cm and the opening 12*a* is a circle of a diameter of about 1 mm, and a plurality of openings 12*a* are formed via a pitch of approximately 1 cm. One example of the vacuum pressure for the suction operation is 180 mmHg.

The sucking device 131 has switch valves 125, 126 connected to the earlier-mentioned tube 13, a discharge device 127 connected to the switch valve 125, and a vacuum pump 130 connected to the switch valve 126. The switch valves 125, 126 are switched by the control device 200 to selectively connect the tube 13 with either of the discharge device 127 and the vacuum pump 130. In other words, in the normal state, the tube 13 is connected to the vacuum pump 130 by the switch valve 126 through the filter 129 in order to carry out the suction operation. At this time, the tube 13 is disconnected from the discharge device 127 by the switch valve 125. The discharge device 127 includes a compressor 128 for generating compressed air. When the tube 13 and the discharge device 127 are connected with each other by the switch valve 125, the connection between the tube 13 and the vacuum pump 130 is shut by the switch valve 126. The compressed air generated at the compressor 128 is jetted out of the openings 12*a* via the switch valve 125, the tube 13, and the conduit 12. Because of the jetting of the compressed air, process scraps sucked in the conduit 12 or remaining at the suction face of the sheet-like article 1 at the suction operation can be blown away and removed.

The positioning device 180 supports the holding member 121 over the sheet-like article 1 in a manner that the contact face 123 can be in touch with the sheet-like article 1. The positioning device 180 also moves the holding member 121 in the thicknesswise direction of the sheet-like article 1 to connect or separate the contact face 123 of the holding member 121 to the process face 1*a* of the sheet-like article 1. The positioning device 180 is supported by an arm 105 set to the frame 103. Concretely, the positioning device 180 has a driving device 181 which moves the holding member 121 in the thicknesswise direction. The driving device 181 is connected to the control device 200 which controls the movement in the thickness direction.

As referred to above, the control device 200 controls operations of the constitutional parts such as driving devices 162, 164 of the moving device 160, etc. Particularly in the embodiment, as described above, the control device 200 controls operations of the laser light generation device 141 and the driving devices 162, 164 of the moving device 60 so that while the contact face 123 of the holding member 121 is kept in touch with the process face 1a of the sheet-like article 1 and the sheet-like article 1 is kept sucked, the process areas 104 are sequentially laser-processed in the direction of the arrows 124 of FIG. 4.

The operation of the laser processing apparatus 101 for sheet-like articles which has the above construction will be described below. Each operation is controlled by the control device 200.

The sheet-like article 1 to be laser-processed is caught by the clamp members 111, 112 of the tension device 110 and pulled in the X direction by the clamp member 112. The X-table 163 and the Y-table 161 of the moving device 160 are driven to laser-process, for instance, the process area 104-1 of FIG. 4. As a result, the hollow part 122 of the holding member 121 is arranged to meet the process area 104-1.

The holding member 121 is moved towards the sheet-like article 1 by the positioning device 180, whereby the contact face 123 of the holding member 121 comes in touch with the process face 1a of the sheet-like article 1. After the contact, the vacuum pump 130 of the sucking device 131 sucks and adheres the sheet-like article 1 to the contact face 123, and the sheet-like article 1 is held to the holding member 121. More specifically, it is designed that the sheet-like article 1 is pulled by the tensile force applied by the clamp members 111, 112 to form a flat plane. Actually, it is possible that the sheet-like article 1 is sagged slightly downward, for example, by about 0.2 mm at portions except for the vicinities of the clamp members 111, 112 and thus such sagging prevents the fine laser processing. In order to avoid such inconvenience, the vicinity of the process area of the sheet-like article 1 is sucked and held by the holding member 121 so as to arrange the sheet-like article 1 in the specified flat plane. Therefore, the holding member 121 is moved towards the sheet-like article 1 by the positioning device 180 to a specified position, that is, a position where the sheet-like article 1 is arranged in the specified flat plane when the sheet-like article 1 is sucked and held at the contact face 123 of the holding member 121 by the holding member 121. When the holding member 121 is moved downward to the specified position, even though the contact face 123 of the holding member 121 does not come in touch with the process face 1a of the sheet-like article 1, the vacuum pump 130 of the sucking device 131 is driven to suck and hold the sheet-like article 1 to the contact face 123, and the sheet-like article 1 is held to the holding member 121 with the sheet-like article 1 arranged in the specified flat plane.

Upon completion of the suction, the laser light is projected from the laser light projection device 140 to the process face 1a of the sheet-like article 1, thereby processing the process area 104-1, for example, forming via holes in the process area 104-1. At this time, for example, as shown in FIGS. 2 and 3, a compressed air is blown into the hollow part 122 from a through hole 122p formed in the frame member 121-3 by a compressed air injection device 500 and the compressed air is sucked and discharged through a through hole 122p formed in the frame member 121-1 confronting to the frame member 121-3 by a suction device 501 to suck and discharge from the hollow part 122 process scraps caused in the laser processing.

When the process area 104-1 is completely processed by the laser light, for example, when all of via holes to be formed are formed in the process area 104-1, while the sheet-like article 1 is kept adhered to the contact face 123, the X-table 163 and the Y-table 161 are moved to move the holding member 121 relative to the sheet-like article 1 in the arrow direction 124A of FIG. 4. The hollow part 122 is accordingly arranged to meet the process area 104-2 adjacent to the process area 104-1. The process area 104-2 is then processed with the laser light. In the same manner afterwards, the holding member 121 is moved relatively to the sheet-like article 1 in the row and column directions in compliance with the arrows 124 and each process area 104 is hence sequentially processed.

After the whole face of the sheet-like article 1 is processed, the vacuum pump 130 is stopped thereby stopping the suction operation to the sheet-like article 1. The holding member 121 is moved to a direction opposite to the sheet-like article 1 by the positioning device 180. The holding of the sheet-like article 1 by the clamp members 111, 112 is released, and the laser-processed sheet-like article 1 is taken from the processing apparatus 101.

When another sheet-like article 1 to be processed remains, the above-described process is repeated.

The switch valves 125, 126 may be changed over, for example, when one sheet-like article 1 is finished being processed, thereby jetting the compressed air from the compressor 128 through the openings 12a to blow off the process scraps sucked into the conduit 12 during the suction operation or left at the suction face of the sheet-like article 1.

Although the case where the whole face of the sheet-like article 1 is processed is described in the above embodiment, the present invention can be applied to a case where a partial face of the sheet-like article 1 is processed.

In FIG. 4, when the holding member 121 is moved relatively to the sheet-like article 1 in the row and column directions in compliance with the arrows 124 and each process area 104 is hence sequentially processed, the holding member 121 moves into contact with the clamp member 112 at each process area 104 in the final row in the Y direction, that is, the row adjacent to and parallel to the clamp member 112, and thus the holding member 121 is prevented from sucking the sheet-like article 1 unlike the other process areas. In such a case, the holding member 121 may not suck and hold the sheet-like article 1. At such vicinity of the clamp member 112, since the sagged amount of the sheet-like article 1 is suppressed to a negligible value by the tensile force from the clamp member 112, fine processing can be performed thereat without sucking and holding the sheet-like article 1.

As described hereinabove, in the laser processing apparatus 101 for sheet-like articles of the embodiment, the holding member 121 and the sheet-like article 1 are moved relatively while the holding member 121 keeps sucking the sheet-like article 1. Therefore, it is not necessary to move the holding member 121 in the thicknesswise direction of the sheet-like article 1 every time the holding member 121 moves between the process areas 104. A time required for processing the sheet-like article 1 can be accordingly shortened in comparison with the previous apparatus and method.

Furthermore, since only the contact face 123 of the frame member 121-4 of the holding member 121 is adapted to be in touch with the sheet-like article 1, the already processed areas can be prevented from being rubbed by the contact face 123 even when the relative movement is carried out with the suction state maintained as above. A deformation of laser-processed parts, a mixture of foreign articles, etc. can be avoided.

Although the embodiment of the process method is directed to the case where the sheet-like article 1 is processed with the laser light, the method is not limited to this laser processing. The present embodiment is applicable, e.g., to processing of a thin sheet-like article being held by the holding member.

Although the sheet-like article 1 is moved in the X, Y directions in the embodiment, oppositely, the holding member and the laser light projection device may be moved while the sheet-like article 1 is fixed.

As is fully described hereinabove, according to the processing apparatus for sheet-like articles and the process method for sheet-like articles in the present invention, since the sheet-like article is held while applying a tensile force to the article and a part of the periphery of a process area of the sheet-like article is held by the holding member when the sheet-like article is processed, laser-processing such as via hole formation can be performed in thin sheet-like articles with laser light without any damage to a member for supporting the articles. Furthermore, when the sheet-like article is processed while held by a part of the holding member, the sheet-like article and the holding member are moved relatively in a manner that the already processed areas of the sheet-like article are not rubbed by the holding member. Therefore, the holding member is not required to be moved in the thicknesswise direction of the sheet-like article at every relative movement, and a process speed to the sheet-like article is improved as compared with the previous apparatus and method. Moreover, the already processed areas are prevented from being brought in physical touch with the holding member, consequently a deformation of the processed areas or a mixture of foreign articles can be eliminated.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A method for processing sheet articles, which comprises:

holding a sheet article while applying a tensile force to the sheet article to be processed and holding a part of a periphery of a process area to be processed of the sheet article by a holding member; and relatively moving the sheet article and the holding member in order to form a plurality of the process areas in the sheet article in such manner that the process areas already formed in the sheet article are not rubbed by the holding member while the part of the periphery of the process area is held.

2. A method for processing sheet articles according to claim 1, further comprising processing the sheet article by laser light.

3. A method for processing sheet articles according to claim 1, further comprising processing the sheet article by laser light to form a through hole.

4. A method for processing sheet articles according to claim 1, wherein said holding of the part of the periphery of the process area is achieved by performing a suction operation.

5. A method for processing sheet articles according to claim 2, wherein said holding of the part of the periphery of the process area is achieved by performing a suction operation.

6. A method for processing sheet articles according to claim 3, wherein said holding of the part of the periphery of the process area is achieved by performing suction operation.

* * * * *